(12) United States Patent
Chiu et al.

(10) Patent No.: US 7,088,575 B2
(45) Date of Patent: Aug. 8, 2006

(54) PORTABLE STORAGE DEVICE

(75) Inventors: Yang-Po Chiu, Shijr (TW); Yi-Ling Kuo, Shijr (TW)

(73) Assignee: Winstron Corporation, Taipei (TW)

( * ) Notice: Subject to any disclaimer, the term of this patent is extended or adjusted under 35 U.S.C. 154(b) by 201 days.

(21) Appl. No.: 10/650,148

(22) Filed: Aug. 27, 2003

(65) Prior Publication Data
US 2004/0125522 A1   Jul. 1, 2004

(30) Foreign Application Priority Data
Dec. 31, 2002   (TW) .............................. 91221689 U (51) Int. Cl.
  *H05K 5/00* (2006.01)
(52) U.S. Cl. ....................... 361/679; 361/684; 361/686
(58) Field of Classification Search ................ 361/679, 361/684, 686
See application file for complete search history.

(56) References Cited

U.S. PATENT DOCUMENTS

| | | | | |
|---|---|---|---|---|
| 5,214,550 A | * | 5/1993 | Chan ....................... | 360/97.01 |
| 6,167,251 A | * | 12/2000 | Segal et al. ................. | 455/406 |
| 6,820,138 B1 | * | 11/2004 | Yin ............................... | 710/2 |
| 2003/0176935 A1 | * | 9/2003 | Lian et al. | |
| 2004/0212966 A1 | * | 10/2004 | Fisher et al. | |

* cited by examiner

*Primary Examiner*—Yean-Hsi Chang
(74) *Attorney, Agent, or Firm*—Ladas & Parry LLP (57) ABSTRACT

A portable storage device. The portable storage device includes a main body and a battery dock. The main body has a connector, a protective element and at least one first power connection portion. The connector and first power connection portion are disposed on the main body. The connector is electrically connected to the data transfer port of an electronic device. The protective element is connected to the main body to protect the connector. The battery dock is connected to the main body and has at least one second power connection portion corresponding to the first power connection portion. The second power connection portion is connected to the first power connection portion when the battery dock is connected to the main body.

19 Claims, 10 Drawing Sheets

PORTABLE STORAGE DEVICE

BACKGROUND OF THE INVENTION

1. Field of the Invention

The present invention relates to a portable storage device, and in particular to a portable storage device that prolongs the lifespan of a USB connector thereof.

2. Description of the Related Art

Figure 1:
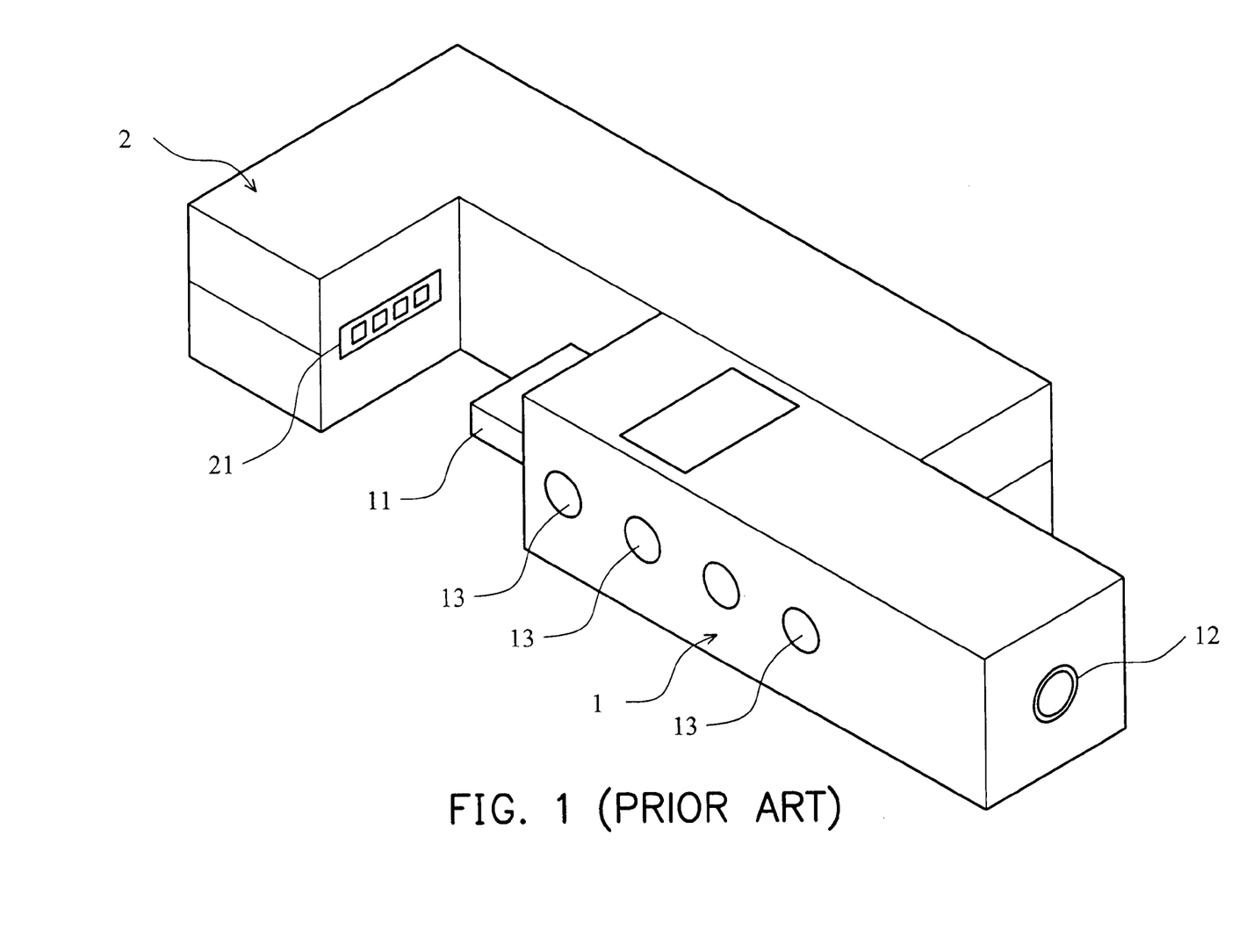
FIG. 1 is a schematic view showing a conventional portable flash memory device in combination with a battery dock.

Generally speaking, a conventional portable flash memory device and MP3 player usually provides such function for playing MP3 files and data access. As shown in FIG. 1, a conventional portable flash memory device 1 has a USB connector 11. The USB connector 11 can be inserted to the USB port (not shown) of a computer to access information. In addition, the portable flash memory device 1 may be connected to a battery dock 2 to acquire power, in order to carry it anywhere. For example, a user can carry the portable flash memory device 1 and listen to MP3 music by plugging an earphone (not shown) to an earphone port 12. As to the means by which the portable flash memory device 1 is connected to the battery dock 2, the USB connector 11 is plugged into a USB port 21 of the battery dock 2. Thus, power can be transmitted to the portable flash memory device 1 from the battery dock 2.

Nevertheless, the number of times a USB connector can be plugged into a USB port is limited, approximately 2400. In addition to plug into the USB port of the computer, the USB connector 11 of the portable flash memory device 1 has to plug into the USB port 21 of the battery dock 2 for acquirement power. Thus, the lifespan of the USB connector 11 is further reduced.

Furthermore, the structure of the USB connector 11 is weak. When the user carries the portable flash memory device 1 to another computer, the USB connector 11 is easily impacted and damaged since it is exposed on surface. In order to protect the USB connector 11 from being damage, we need to combine the USB connector 11 with the battery dock 2. However, the heavy combination of the USB connector 11 and the battery dock 2 reduces the lifespan of the USB connector 11.

Additionally, functions provided by the portable flash memory device 1 are performed by means of a plurality of buttons 13. Thus, the structure of the portable flash memory device 1 is complicated and the volume thereof is large.

Hence, there is a need to provide a portable storage device that prolongs the lifespan of the USB connector and protects the USB connector thereof from being damage. Meanwhile, a single control element should be disposed on the portable storage device to replace the conventional buttons 13, thereby simplifying the operation and reducing the volume thereof.

SUMMARY OF THE INVENTION

Accordingly, an object of the invention is to provide a portable storage device. The portable storage device includes a main body and a battery dock. The main body has a connector, a protective element and at least one first power connection portion. The connector and first power connection portion are disposed on the main body. The connector is electrically connected to a data transfer port of an electronic device. The protective element is connected to the main body to protect the connector. The battery dock is connected to the main body and has at least one second power connection portion equally corresponding to the first power connection portion. The second power connection portion is connected to the first power connection portion when the battery dock is connected to the main body.

Accordingly, the main body is a portable flash memory device and MP3 player.

Accordingly, the protective element of the main body is a sliding cover connected to the main body.

Accordingly, the protective element of the main body is a protective cover detachably connected to the main body.

Accordingly, the protective element of the main body is a bellows-type protective cover flexibly connected to the main body.

The main body further comprises a single control providing selection of functions thereof.

The main body further comprises an accessory-attachment loop.

The main body further comprises an earphone jack.

The main body further comprises a write-protection control to prevent data from being written to the main body.

The battery dock further comprises a battery cover.

The battery dock further comprises a release button to release the battery cover.

The surface of the protective element further comprises at least one anti-slip strip.

Accordingly, the connector is a USB connector.

The battery dock further comprises a connector accommodation portion to accommodate the connector.

A detailed description is given in the following embodiments with reference to the accompanying drawings.

BRIEF DESCRIPTION OF THE DRAWINGS

The present invention can be more fully understood by reading the subsequent detailed description and examples with references made to the accompanying drawings, wherein.

DETAILED DESCRIPTION OF THE INVENTION

First Embodiment

Figure 2A:
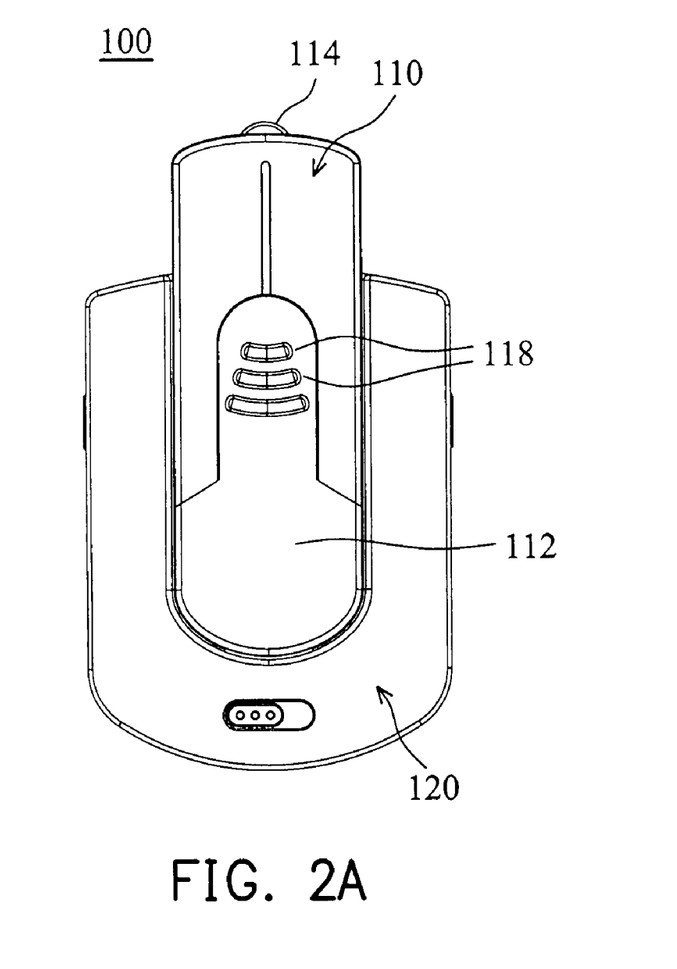
FIG. 2A is a top view showing the first embodiment of the portable storage device of the invention.

Referring to FIG. 2A, the portable storage device 100 comprises a main body 110 and a battery dock 120. In this embodiment, the main body 110 is a portable flash memory device and MP3 player connected to a computer (not shown) to access information. Additionally, the main body 110 can play MP3 files.

Figure 2B:
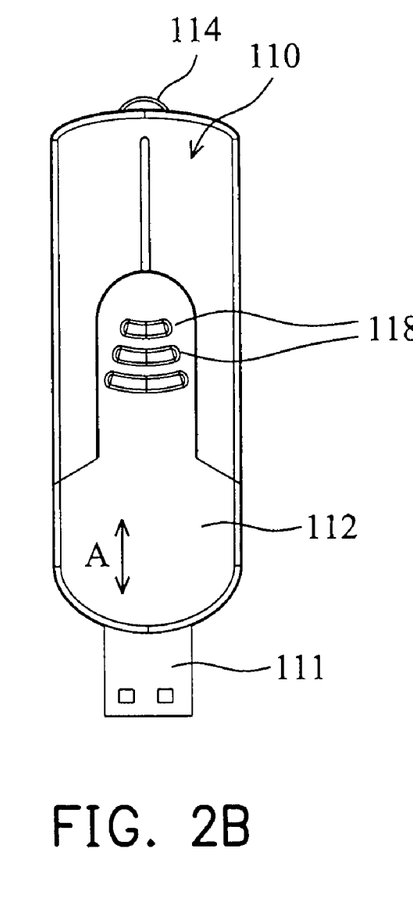
FIG. 2B is a top view showing the main body according to FIG. 2A.
Figure 2C:
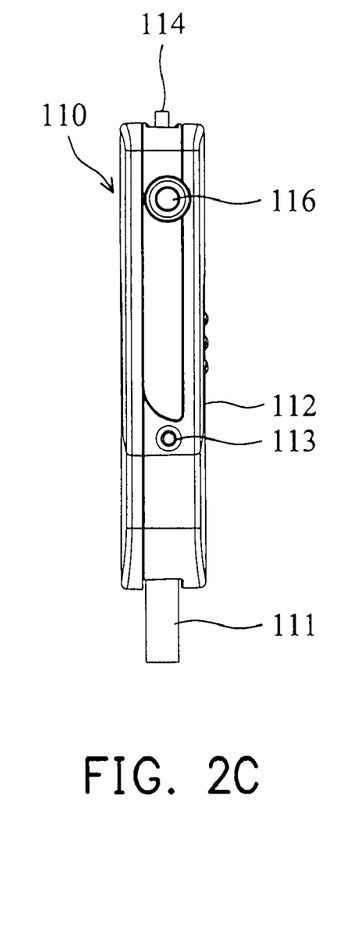
FIG. 2C is a left side view showing the main body according to FIG. 2B.
Figure 2D:
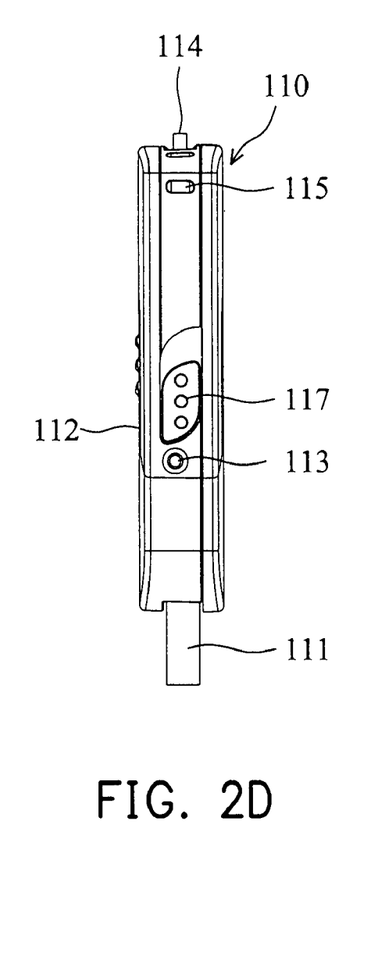
FIG. 2D is a right side view showing the main body according to FIG. 2B.
Figure 2E:
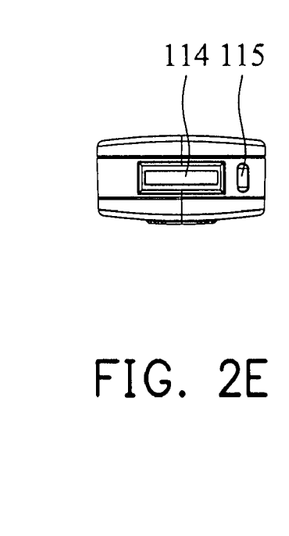
FIG. 2E is a rear view showing the main body according to FIG. 2B.

Referring to FIG. 2B, FIG. 2C and FIG. 2D, the main body 110 further comprises a USB connector 111, a sliding cover 112 and two first power connection portions 113. The sliding cover 112 is connected to the main body 110 and slides in the direction shown by arrow A. The two first power connection portions 113 are respectively disposed on two sides of the main body 110, as shown in FIG. 2C and FIG. 2D.

Figure 2F:
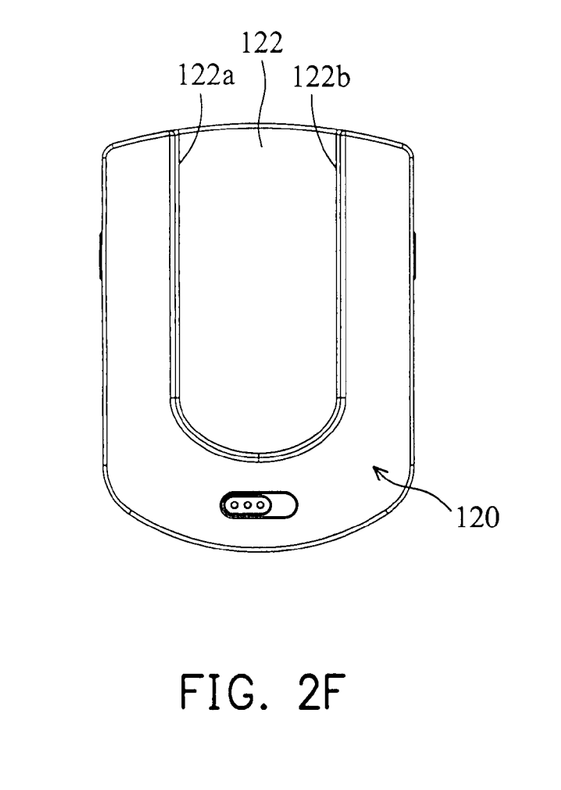
FIG. 2F is a top view showing the battery dock according to FIG. 2A.
Figure 2G:
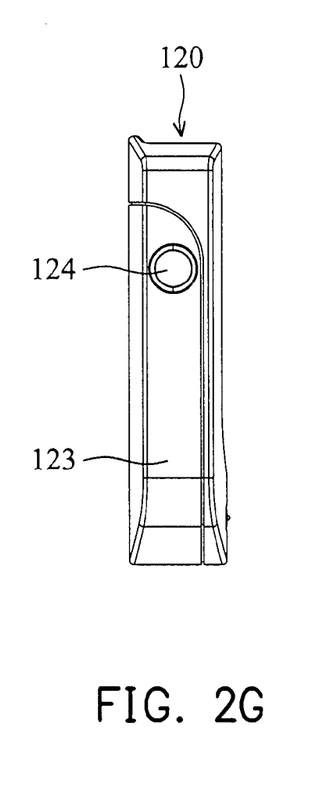
FIG. 2G is a left side view showing the battery dock according to FIG. 2F.
Figure 2H:
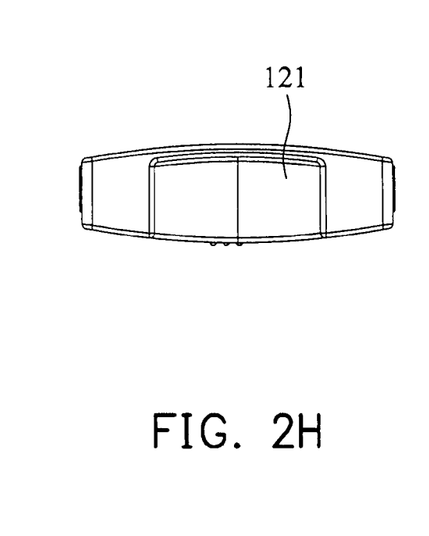
FIG. 2H is a rear view showing the battery dock according to FIG. 2F.

Referring to FIG. 2F, FIG. 2G and FIG. 2H, the battery dock 120 further comprises two second power connection portions (not shown), a connector accommodation portion 121 and a main body accommodation portion 122. The two second power connection portions are disposed on two opposite inner walls 122a and 122b of the main body accommodation portion 122, respectively. When the main body 110 is accommodated in the main body accommodation portion 122, the first power connection portions 113 of the main body 110 are connected to the second power connection portions of the battery dock 120.

Accordingly, when the main body 110 is accommodated in the main body accommodation portion 122, the USB connector 111 is in the connector accommodation portion 121 and first power connection portions 113 are electrically connected to the second power connection portions of the battery dock 120. Thus, the battery dock 120 can provide power to the main body 110 and the main body 110 can be operated by a user. The advantage of this kind of power connection is that the number of times of the USB connector 111 plugged in a USB port is reduced, thereby prolonging the lifespan of the USB connector 111.

In another aspect, when the main body 110 is separated from the battery dock 120, the sliding cover 112 can be moved toward the USB connector 111 to cover the USB connector 111, thereby protecting the USB connector 111 from damage.

Additionally, as shown in FIGS. 2B, 2C and 2D, the main body 110 further comprises a single control 114, an accessory-attachment loop 115, an earphone jack 116 and a write-protection button 117. The single control 114 can select the function provided by the main body 110, such as playing MP3 files. The single control 114 can replace the conventional multiple buttons. Thus, the operation of the main body 110 is simplified and the volume thereof is reduced. The user can carry the main body 110 by a string fastened into the accessory-attachment loop 115. The write-protection button 117 can prevent data or information from being written to the main body 110 inadvertently.

In addition, as shown in FIG. 2A and FIG. 2B, the surface of the sliding cover 112 further comprises at least one anti-slip strips 118. The anti-slip strips 118 enhance appearance of the main body 110 and make it easier to push or disassemble the sliding cover 112.

Furthermore, as shown in FIG. 2F, FIG. 2G and FIG. 2H, a battery cover 123 and a release button 124 are disposed on the battery dock 120. When the release button 124 is pressed, the battery cover 123 can slide out of the battery dock 120. Thus, the batteries in the battery dock 120 can be replaced easily.

Second Embodiment

Figure 3A:
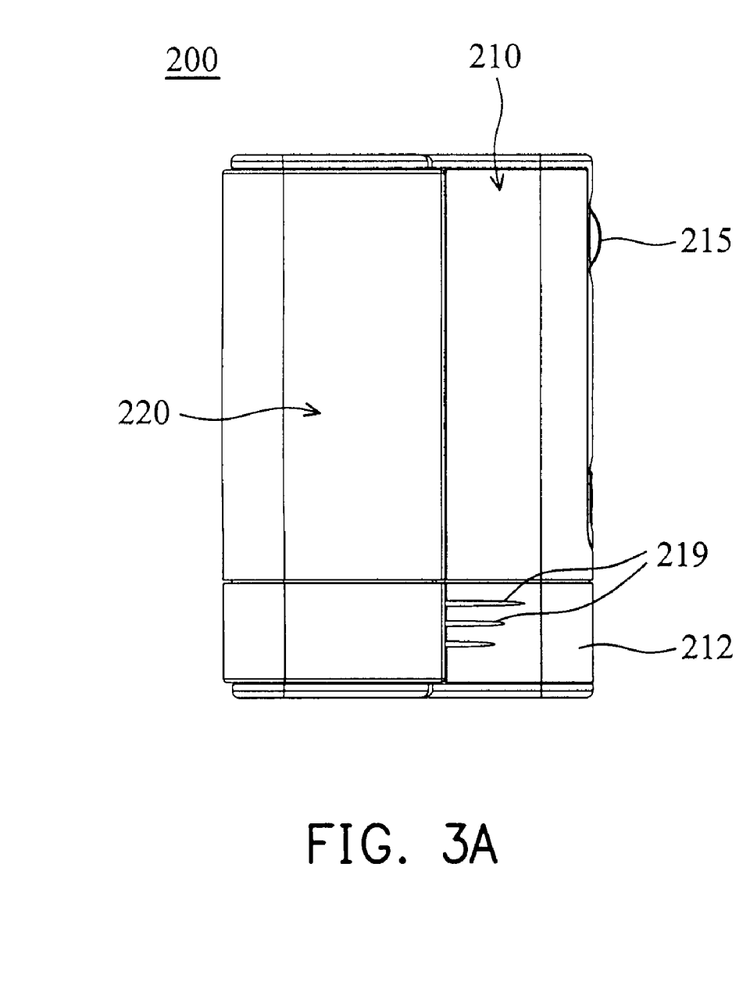
FIG. 3A is a top view showing the second embodiment of the portable storage device of the invention.

Referring to FIG. 3A, the portable storage device 200 comprises a main body 210 and a battery dock 220. In this embodiment, the main body 210 is a portable flash memory device and MP3 player connected to a computer (not shown) to access information. Additionally, the main body 110 can play MP3 files.

Figure 3B:
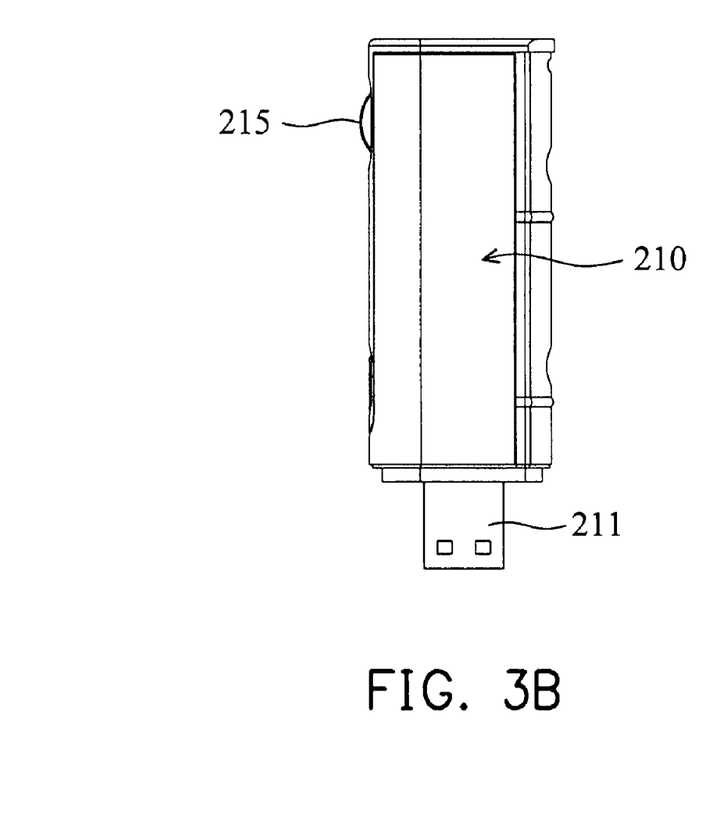
FIG. 3B is a top view showing the main body according to FIG. 3A.
Figure 3C:
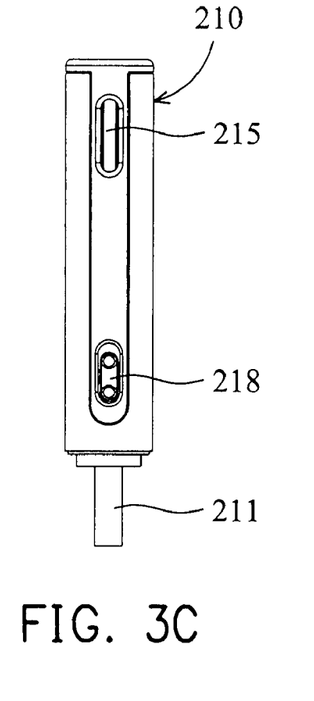
FIG. 3C is a left side view showing the main body according to FIG. 3B.
Figure 3D:
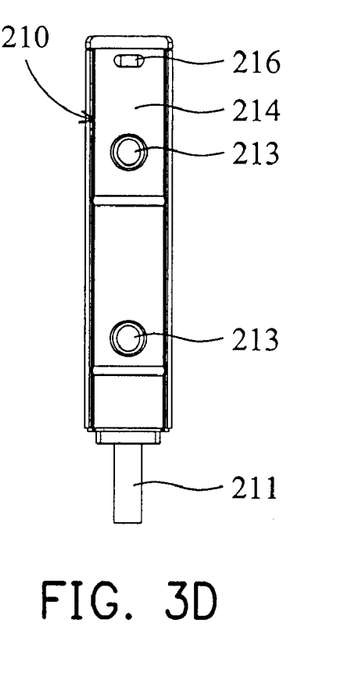
FIG. 3D is a right side view showing the main body according to FIG. 3B.
Figure 3E:
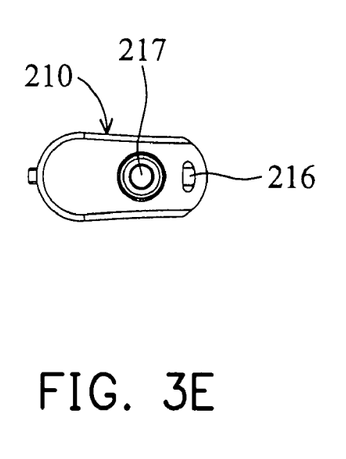
FIG. 3E is a rear view showing the main body according to FIG. 3B.

Referring to FIG. 3A, FIG. 3B and FIG. 3D, the main body 210 further comprises a USB connector 211, a protective cover 212 and two first power connection portions 213. The protective cover 212 is detachably connected to the main body 210. The first power connection portions 213 are disposed on one side 214 of the main body 210, as shown in FIG. 3D.

Figure 3F:
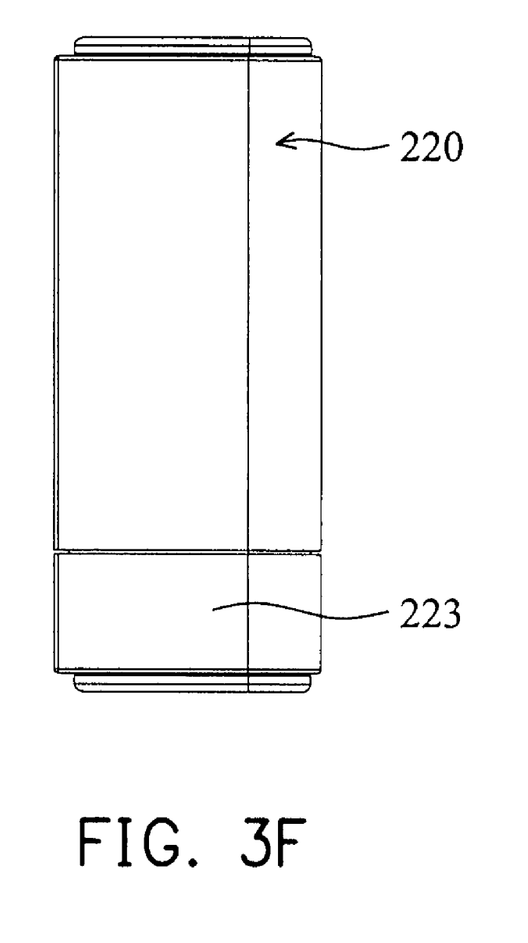
FIG. 3F is a top view showing the battery dock according to FIG. 3A.
Figure 3G:
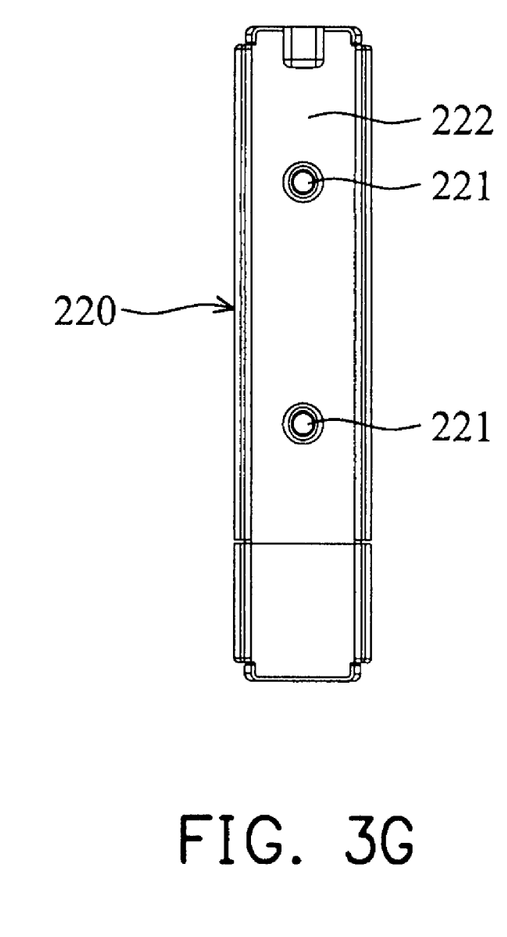
FIG. 3G is a left side view showing the battery dock according to FIG. 3F.

Referring to FIG. 3F and FIG. 3G, the battery dock 220 has two second power connection portions 221 disposed on one side 222 thereof. Thus, when the main body 210 is positioned on the battery dock 220, the first power connection portions 213 are respectively connected to the second power connection portions 221.

Accordingly, the USB connector 211 may be covered by the protective cover 212 before the main body 210 is positioned on the battery dock 220. When the main body 210 is positioned on the battery dock 220, the first power connection portions 213 are electrically connected to the second power connection portions 221. Thus, the main body 210 can be powered by the battery dock 220. The advantage of this kind of connection is that the number of times of the USB connector 211 plugged in a USB port can be reduced, thereby prolonging the lifespan of the USB connector 211.

In another aspect, when the main body 210 is separated from the battery dock 220, the protective cover 212 protectively covers the USB connector 211 against being damage.

Additionally, as shown in FIGS. 3B, 3C, 3D and 3E, the main body 210 further comprises a single control 215, an accessory-attachment loop 216, an earphone jack 217 and a write-protection button 218. The single control 215 selects the function provided by the main body 210, such as playing MP3 files. As mentioned in the first embodiment, the single control 215 replaces the conventional multiple buttons. Thus, the operation of the main body 210 is simplified and the volume thereof is reduced. The user can carry the main body 210 by a string fastened into the accessory-attachment loop 216. The write-protection button 218 prevents data or information from being written to the main body 210 inadvertently.

In addition, as shown in FIG. 3A, the surface of the protective cover 212 further comprises at least one anti-slip strips 219. The anti-slip strips 219 enhance the appearance of the portable storage device 200 and make protective cover 212 more easiler opening and closing Furthermore, as shown in FIG. 3F and FIG. 3G, a battery cover 223 is disposed on the battery dock 220. We can replace the batteries in the battery dock 220 by separating the battery cover 223 from the battery dock 220.

Third Embodiment

Figure 4A:
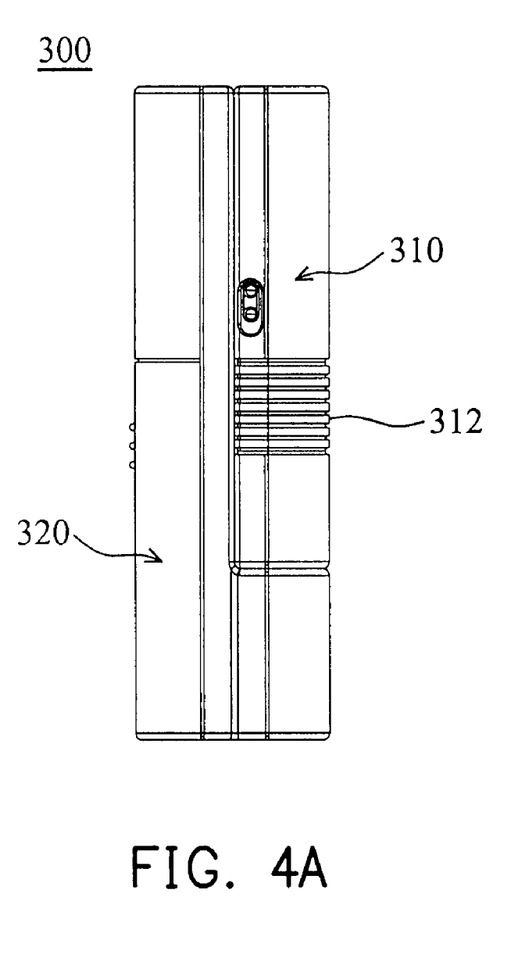
FIG. 4A is a top view showing the third embodiment of the portable storage device of the invention.

Referring to FIG. 4A, the portable storage device 300 comprises a main body 310 and a battery dock 320. In this embodiment, the main body 310 is a portable flash memory device and MP3 player connected to a computer (not shown) to access information. Additionally, the main body 310 can play MP3 files.

Figure 4B:
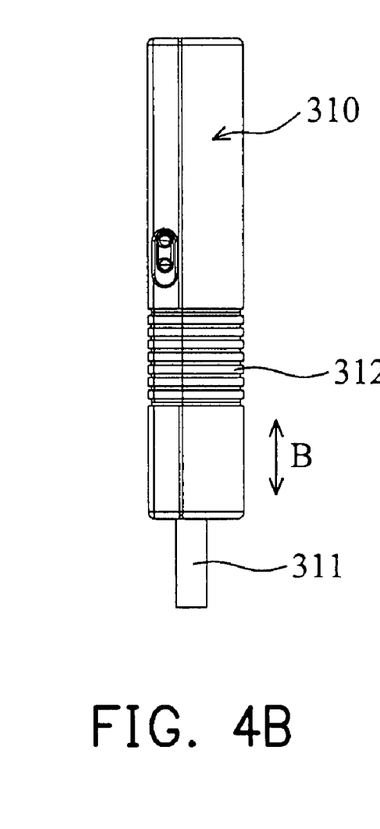
FIG. 4B is a top view showing the main body according to FIG. 4A.
Figure 4C:
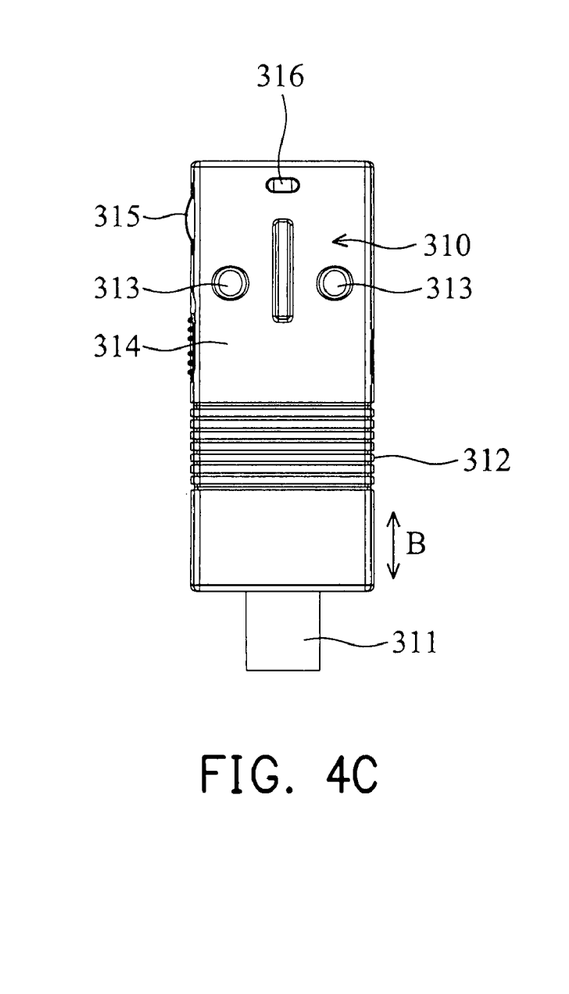
FIG. 4C is a left side view showing the main body according to FIG. 4B.
Figure 4D:
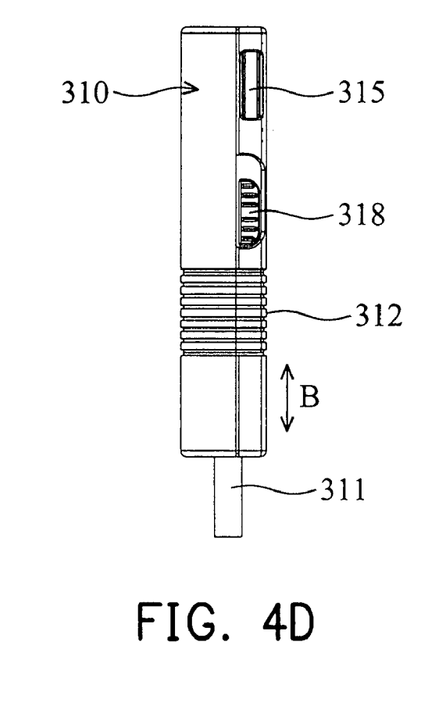
FIG. 4D is a bottom view showing the main body according to FIG. 4B.
Figure 4E:
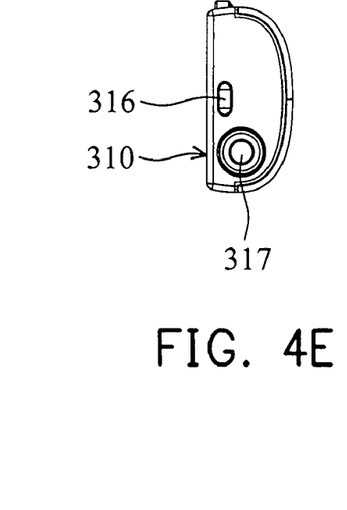
FIG. 4E is a rear view showing the main body according to FIG. 4B.

Referring to FIG. 4B, FIG. 4C and FIG. 4D, the main body 310 further comprises a USB connector 311, a bellows-type protective cover 312 and two first power connection portions 313. The bellows-type protective cover 312 is flexibly connected to the main body 310. Namely, the bellows-type protective cover 312 can expand and contract in the direction shown by arrow B. The first power connection portions 313 are disposed on one side 314 of the main body 310, as shown in FIG. 4C.

Figure 4F:
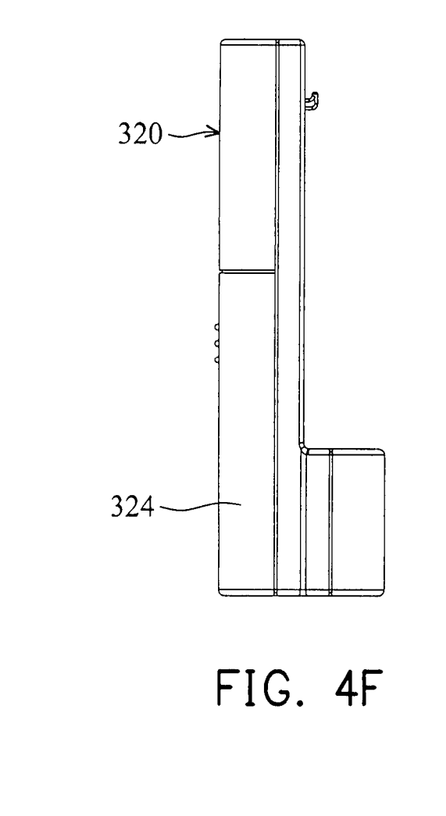
FIG. 4F is a top view showing the battery dock according to FIG. 4A.
Figure 4G:
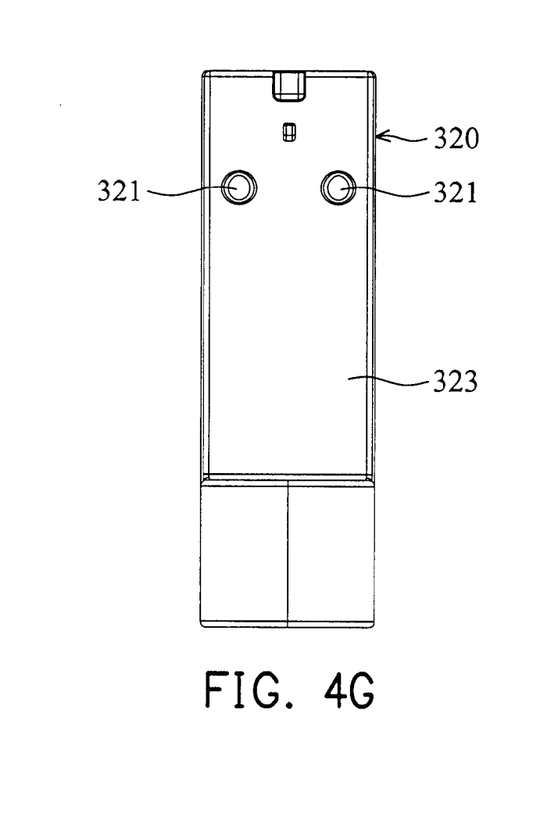
FIG. 4G is a right side view showing the battery dock according to FIG. 4F.
Figure 4H:
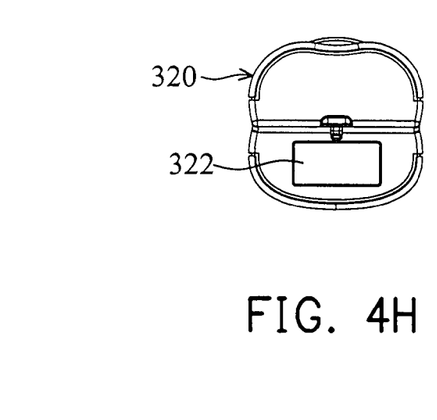
FIG. 4H is a rear view showing the battery dock according to FIG. 4G.

Referring to FIG. 4F, FIG. 4G and FIG. 4H, the battery dock 320 further comprises two second power connection portions 321 and a connector accommodation portion 322. The two second power connection portions 321 are disposed on one side 323 of the battery dock 320. Thus, when the main body 310 is positioned on the battery dock 320, the first power connection portions 313 are respectively connected to the second power connection portions 321.

Accordingly, when the main body 310 is positioned on the battery dock 320, the USB connector 311 is accommodated in the connector accommodation portion 322 and the first power connection portions 313 are electrically connected to the second power connection portions 321. Thus, the main body 310 can be powered by the battery dock 320. The advantage of this kind of connection is that the number of times of the USB connector 311 plugged in a USB port is reduced, thereby prolonging the lifespan of the USB connector 311.

In another aspect, when the main body 310 is separated from the battery dock 320, the bellows-type protective cover 312 can be pushed toward the USB connector 311. The extended bellows-type protective cover 312 protectively covers the USB connector 311 against being damage.

Additionally, as shown in FIGS. 4B, 4C, 4D and 4E, the main body 310 further comprises a single control 315, an accessory-attachment loop 316, an earphone jack 317 and a write-protection button 318. The single control 315 selects the function provided by the main body 310, such as playing MP3 files. The single control 315 replaces the conventional multiple buttons. Thus, the operation of the main body 310 is simplified and the volume thereof is reduced. The user can carry the main body 310 by a string fastened into the accessory-attachment loop 316. The write-protection button 318 prevents data or information from being written to the main body 310 inadvertently.

Furthermore, as shown in FIGS. 4F, 4G and 4H, a battery cover 324 is disposed on the battery dock 320. We can replace the batteries by separating the battery cover 324 from the battery dock 320.

While the invention has been described by way of example and in terms of the preferred embodiments, it is to be understood that the invention is not limited to the disclosed embodiments. To the contrary, it is intended to cover various modifications and similar arrangements (as would be apparent to those skilled in the art). Therefore, the scope of the appended claims should be accorded the broadest interpretation so as to encompass all such modifications and similar arrangements.

What is claimed is:

1. A portable storage device, comprising:
   a main body having a connector, a protective element, at least one first power connection portion, a single control, and a write-protection button, wherein the connector and first power connection portion are disposed on the main body, the connector is electrically connected to a data transfer port of an electronic device, the protective element is connected to the main body to protect the connector, the surface of the protective element comprises at least one anti-slip strip, the single control provides selection of functions of the main body, and the write-protection button prevents data from being written to the main body; and
   a battery dock connected to the main body and having at least one second power connection portion equally corresponding to the first power connection portion, wherein the second power connection portion is connected to the first power connection portion when the battery dock is connected to the main body.

2. The portable storage device as claimed in claim 1, wherein the main body is a portable flash memory device and MP3 player.

3. The portable storage device as claimed in claim 1, wherein the protective element of the main body is a sliding cover connected to the main body.

4. The portable storage device as claimed in claim 1, wherein the protective element of the main body is a protective cover detachably connected to the main body.

5. The portable storage device as claimed in claim 1, wherein the protective element of the main body is a bellows-type protective cover flexibly connected to the main body.

6. The portable storage device as claimed in claim 1, wherein the main body further comprises an accessory-attachment loop, an earphone jack.

7. The portable storage device as claimed in claim 1, wherein the battery dock further comprises a battery cover and a release button to release the same.

8. The portable storage device as claimed in claim 1, wherein the connector is a USB connector.

9. The portable storage device as claimed in claim 1, wherein the battery dock further comprises a connector accommodation portion to accommodate the connector.

10. A portable storage device, comprising:
    a main body having a connector, a sliding cover, at least one first power connection portion, and a write-protection button, wherein the connector and first power connection portion are disposed on the main body, the connector is electrically connected to a data transfer port of an electronic device, the sliding cover is slidably connected to the main body to protect the connector, the surface of the sliding cover comprises at least one anti-slip strip, and the write-protection button prevents data from being written to the main body; and
    a battery dock connected to the main body and having at least one second power connection portion equally corresponding to the first power connection portion, a connector accommodation portion and a main body accommodation portion, wherein the second power connection portion is connected to the first power connection portion, the connector is accommodated in the connector accommodation portion and the main body is accommodated in the main body accommodation portion when the battery dock is connected to the main body.

11. The portable storage device as claimed in claim 10, wherein the main body is a portable flash memory device and MP3 player and further comprises a single control to select the function thereof, an accessory-attachment loop, and an earphone jack.

12. The portable storage device as claimed in claim 10, wherein the battery dock further comprises a battery cover and a release button to release the same.

13. The portable storage device as claimed in claim 10, wherein connector is a USB connector.

14. A portable storage device, comprising:
a main body having a connector, a protective cover, at least one first power connection portion, a single control, and a write-protection button, wherein the connector and first power connection portion are disposed on the main body, the connector is electrically connected to a data transfer port of an electronic device, the protective cover is detachably connected to the main body to protect the connector, the surface of the protective cover comprises at least one anti-slip strip, the single control provides selection of functions of the main body, and the write-protection button prevents data from being written to the main body; and
a battery dock connected to the main body and having at least one second power connection portion equally corresponding to the first power connection portion, wherein the second power connection portion is connected to the first power connection portion when the battery dock is connected to the main body.

15. The portable storage device as claimed in claim 14, wherein the main body is a portable flash memory device and MP3 player and further comprises an accessory-attachment loop and an earphone jack.

16. The portable storage device as claimed in claim 14, wherein the battery dock further comprises a battery cover, and the connector is a USB connector.

17. A portable storage device, comprising:
a main body having a connector, a bellows-type protective cover and at least one first power connection portion, wherein the connector and first power connection portion are disposed on the main body, the connector is electrically connected to a data transfer port of an electronic device, and the bellows-type protective cover is flexibly connected to the main body to protect the connector; and
a battery dock connected to the main body and having a connector accommodation portion and at least one second power connection portion corresponding to the first power connection portion, wherein the second power connection portion is connected to the first power connection portion and the connector is accommodated in the connector accommodation portion when the battery dock is connected to the main body.

18. The portable storage device as claimed in claim 17, wherein the main body is a portable flash memory device and MP3 player and further comprises a single control to select the function thereof, an accessory-attachment loop, an earphone jack and a write-protection button to prevent data from being written to the main body.

19. The portable storage device as claimed in claim 17, wherein the battery dock further comprises a battery cover, and the connector is a USB connector.

* * * * *

UNITED STATES PATENT AND TRADEMARK OFFICE
CERTIFICATE OF CORRECTION

| | | |
|---|---|---|
| PATENT NO. | : 7,088,575 B2 | Page 1 of 1 |
| APPLICATION NO. | : 10/650148 | |
| DATED | : August 8, 2006 | |
| INVENTOR(S) | : Yang-Po Chiu et al. | |

It is certified that error appears in the above-identified patent and that said Letters Patent is hereby corrected as shown below:

Title page,
Item (73), Assignee, change "Winstron Corporation, Taipei (TW)" to -- Wistron Corporation, Taipei (TW) --

Signed and Sealed this

Twenty-seventh Day of November, 2007

JON W. DUDAS
*Director of the United States Patent and Trademark Office*